United States Patent [19]
Crist et al.

[11] Patent Number: 6,158,119
[45] Date of Patent: Dec. 12, 2000

[54] CIRCUIT BOARD PANEL TEST STRIP AND ASSOCIATED METHOD OF ASSEMBLY

[75] Inventors: Michael A. Crist, Lake in the Hills, Ill.; David S. Dehaan, Delavan, Wis.; Ronald J. Schmidt, Grayslake, Ill.

[73] Assignee: Motorola, Inc., Schaumburg, Ill.

[21] Appl. No.: 08/892,207

[22] Filed: Jul. 14, 1997

[51] Int. Cl.[7] .................................................. H05K 3/34
[52] U.S. Cl. ................................ 29/840; 29/593; 29/832; 29/833; 29/834; 29/842; 29/843; 29/874; 324/757; 324/758; 324/763; 324/764
[58] Field of Search .............................. 29/593, 832, 833, 29/842, 834, 840, 843, 874; 324/763, 764, 757, 758

[56] References Cited

U.S. PATENT DOCUMENTS

| | | | |
|---|---|---|---|
| 3,992,772 | 11/1976 | Scannell et al. | 29/626 X |
| 4,185,298 | 1/1980 | Billet et al. | 358/106 |
| 4,494,139 | 1/1985 | Shima et al. | 358/101 X |
| 4,941,256 | 7/1990 | Capson et al. | 29/833 |
| 4,984,354 | 1/1991 | Mohara et al. | 29/740 X |
| 5,224,262 | 7/1993 | Takaichi et al. | 29/721 X |
| 5,278,634 | 1/1994 | Skunes et al. | 356/400 |
| 5,457,880 | 10/1995 | McKinley et al. | 29/833 |
| 5,467,525 | 11/1995 | Pine et al. | 29/743 X |
| 5,768,759 | 6/1998 | Hudson | 29/407.04 X |

OTHER PUBLICATIONS

View Bazic 12 System Description and Specifications, by View Engineering, Inc., 1991.
Kent, Kevin, "Apparatus and Method for Adjusting an Electronic Part Template", U.S.S.N. 08/698,632, filed Aug. 16, 1996, Atty. Docket No. CE0110R.

*Primary Examiner*—Valencia Martin-Wallace
*Assistant Examiner*—Binh-An Nguyen
*Attorney, Agent, or Firm*—Mark D. Patrick; Hisashi D. Watanabe

[57] ABSTRACT

A test strip (209–211) is associated with a circuit board (201–203) to facilitate inspection of the circuit board (201–203) during an assembly process (100). The board (201–203) has a plurality of pads (208) to receive solder paste (400) and electronic parts (600). The pads (208) are electrically coupled such that the received parts (600), once assembled, form an electronic circuit. The strip (209–211) has at least one pad (308, 310), electrically isolated from the pads (208), to receive solder paste (400) and/or parts (600). Inspection of the received solder paste (400) and/or parts (600) of the strip (209–211) indicates the accuracy of the received solder paste (400) and parts (600) on the pads (208) of the board (201–203).

19 Claims, 6 Drawing Sheets

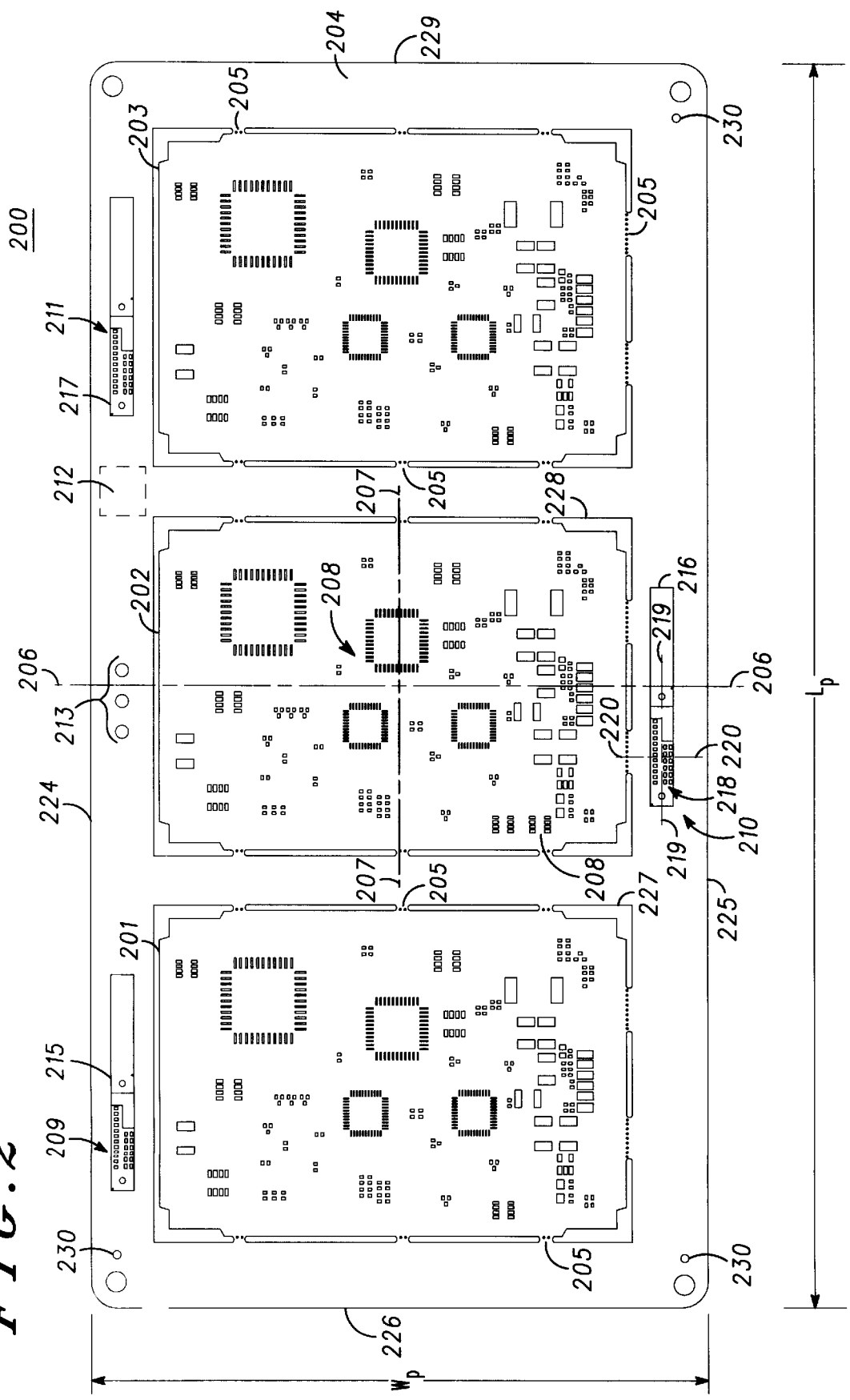

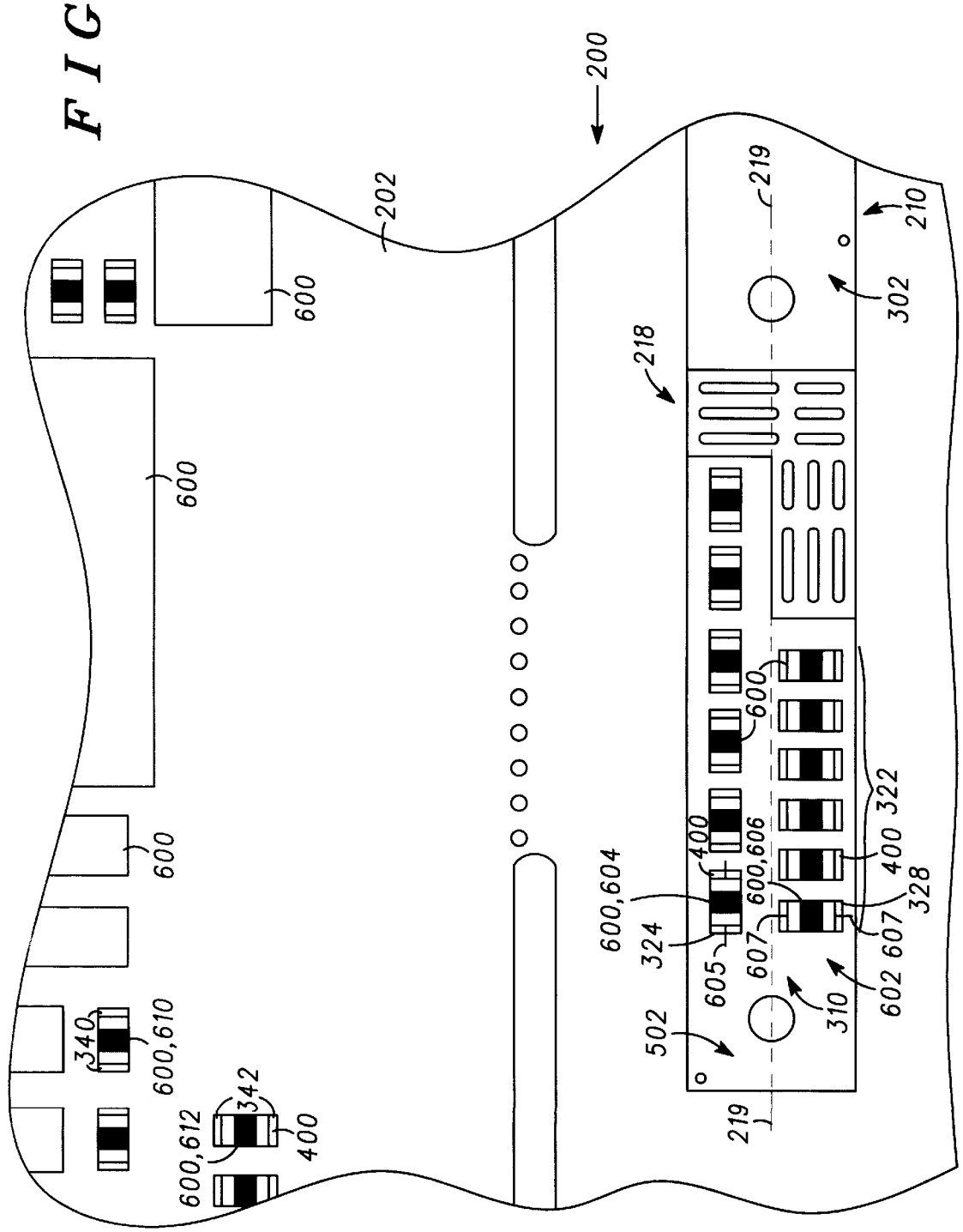

CIRCUIT BOARD PANEL TEST STRIP AND ASSOCIATED METHOD OF ASSEMBLY

FIELD OF THE INVENTION

The present invention relates generally to circuit boards and, more particularly, to a test strip associated with a circuit board for facilitating accurate assembly thereof.

BACKGROUND OF THE INVENTION

Many electronic devices, such as radiotelephones, include one or more circuit boards having electronic parts assembled thereto. To competitively manufacture these devices, the parts must be assembled to the board via an assembly process that is quality controlled. One way of achieving quality control of the assembly process includes periodically removing a single board from the process to inspect the alignment of the parts assembled to the board using a video metrology system.

The video system includes a placement table to receive a board designated for inspection, a high magnification camera movably positioned above the table, a downward projecting light source positioned above the table to illuminate the received board, and a processing section coupled to the camera. Upon reception of the board, the camera, responsive to coordinates contained in a board layout stored in the processing section, captures an image of a first part and couples the image to the processing section. The processing section, using gray scale image contrasting, detects differences in gray scale levels representing edges of the first part, edges of board attributes, such as pads upon which the part is seated, and edges of the solder attaching the part to the pad. The processing section determines an alignment of the first part from the detected edges and compares the alignment to a range of prestored alignment values contained in the board layout. When the alignment is not within the range, the processing section indicates that the process is out, or is close to being out, of control and must be adjusted. After inspecting the first part, the video system sequentially proceeds to the remaining parts on the board.

Unfortunately, the number of parts assembled to a circuit board used in, for example, a radiotelephone often exceeds 500 and inspection of each part takes approximately 6 secs. Thus, the inspection of a single board can take on the upwards of 3000 secs. If the assembly process is halted during the inspection, a downtime cost resulting in reduced throughput is incurred. If the assembly process is allowed to continue during the inspection and misaligned parts are found, a sizable cost associated with allocating repair resources to rework each of the circuit boards built during the inspection is incurred.

In addition, each circuit board to be inspected must have a corresponding layout stored in the video system. A separate layout must be stored in the video system for each circuit board having a different topography. For competitive manufacturers that build a variety of different devices having different circuit boards, a sizable cost associated with the creation and maintenance of many board layouts is incurred.

Therefore, what is needed is an apparatus and method that reliably measures the accuracy of highly populated circuit boards without h having to inspect each part assembled thereto and facilitates management of a large number of unique circuit board topographies.

BRIEF DESCRIPTION OF THE DRAWINGS

FIG. 2 is a top plan view of a circuit board panel having a circuit board and an associated test strip;

FIG. 6 is an enlarged, fragmentary top plan view of the circuit board and the associated test strip of FIG. 2 following a place parts step of the assembly process of FIG. 1;

DETAILED DESCRIPTION OF THE PREFERRED EMBODIMENTS

A test strip is associated with a circuit board to facilitate inspection of the circuit board during an assembly process. The test strip includes a small number of pads that are populated with solder paste during a place solder paste step of the process and populated with electronic parts during a place parts step of the process. After the placement steps, the test strip pads and parts are inspected for placement accuracy. The quantity and arrangement of the pads is such that the accuracy of the placement on the test strip closely approximates the accuracy with which the paste and parts will be placed on the circuit board. In the event of inaccuracies, adjustments are made to the equipment employed in the place solder paste step and place parts step prior to population of subsequent circuit boards. Thus, by employing the test strip, inspection of the entire circuit board can be avoided.

Figure 1:
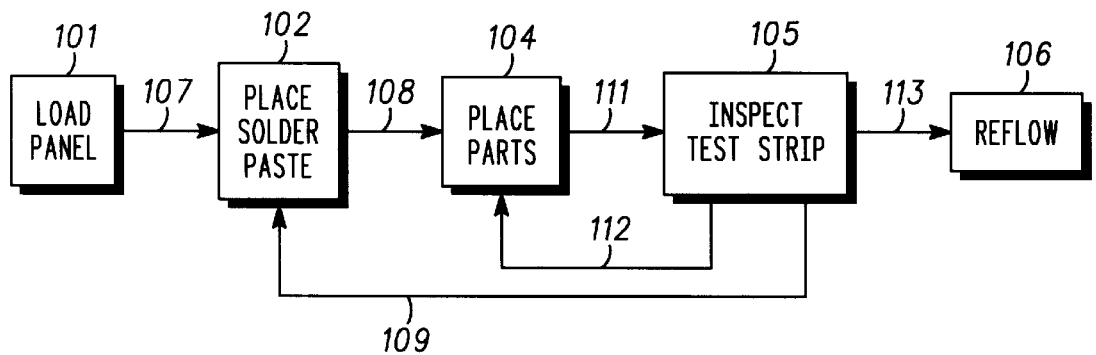
FIG. 1 is a block diagram illustrating an assembly process of a circuit board panel.

An assembly process 100 of FIG. 1 assembles electronic parts to circuit boards to form electrical circuits. The assembly process 100 includes a load panel step 101, a place solder paste step 102, a place parts step 104, an inspect test strip step 105, and a reflow step 106. At the load panel step 101, one or more of an empty circuit board panel 200 of FIG. 2 is inserted into the assembly process 100. The load panel step 101 is performed by an automated board handler machine or other suitable alternative that outputs panels, one at a time, onto a conveyor.

The panel 200 is a multi-layer printed circuit board panel comprised of printed circuit board material such as polyimide, epoxy-based flame retardant industrial fiberglass (G10-FR4), or other suitable material. The panel 200 is double-sided; however, to avoid redundancy, discussion hereinbelow of the assembly process 100 of FIG. 1 will be limited to a side of the panel 200 illustrated in FIG. 2. In the illustrated embodiment, the panel 200 is substantially planar thereacross and, has a length Lp of approximately 115 mm, a width Wp of approximately 215 mm, and a thickness of approximately 1 mm.

The panel 200 includes circuit boards 201, 202, and 203, a rail 204 surrounding the boards 201–203, and a plurality of breakaways 205 detachably connecting the boards 201–203 to the rail 204. Board 202, which is representative of any one of the boards 201–203, includes a longitudinal axis 206, a transverse axis 207 perpendicular to the longitudinal axis, and a plurality of metallic pads 208 carried thereon. The pads 208 are arranged and oriented to receive electronic parts and electrically coupled by metallic traces disposed within the board 202 (and, thus, not visible in FIG. 2), such that an electrical circuit is formed upon completion of the assembly process 100 of FIG. 1. The pads 208 of FIG. 2 and the traces are comprised of copper, aluminum, or other suitable conductive material.

The rail 204 supports the boards 201–203 during the assembly process 100 of FIG. 1. The rail 204, as shown in FIG. 2, has longitudinal legs 224 and 225 and transverse rungs 226, 227, 228, and 229. The rungs 226–229 extend between the legs 224 and 225 so as to separate the boards 201–203 from one another. The legs 224 and 225 include test strips 209, 210, and 211, a test strip block skip region 212, a set of board block skip markers 213, and board fiducials 230.

The strips 209–211 are employed to measure the accuracy of the assembly process 100 of FIG. 1. The strips 209–211 have a one-to-one correspondence with the boards 201–203, respectively. The strips 209–211 include windows 215, 216, and 217, respectively. The windows 215–217 are integral to the legs 224 and 225 so as to be flush therewith and are formed of a translucent material, such as bare layers of the printed circuit board material devoid of traces. In the illustrated embodiment, the windows 215–217 have a length of approximately 30 mm and a width of approximately 3 mm. The window 215 is formed in the leg 224 between the rungs 226 and 227 such that the strip 209 is adjacent to, and associated with, the board 201. The window 216 is formed in the leg 225 between the rungs 227 and 228 such that the strip 210 is adjacent to, and associated with, the board 202. The window 217 is formed in the leg 224 between the rungs 228 and 229 such that strip 211 is adjacent to, and associated with, the board 203. Positioning the strips 209–211 on different ones of the legs 224 and 225 in the triangular arrangement shown in FIG. 2 enhances inspection accuracy by ensuring that inspection samples are taken across the entire board area. However, because of their constrained dimensions, the strips 209–211 can alternately be arranged on the rail 204 or positioned directly on the boards 201–203 in locations devoid of traces on all layers.

Figure 3:
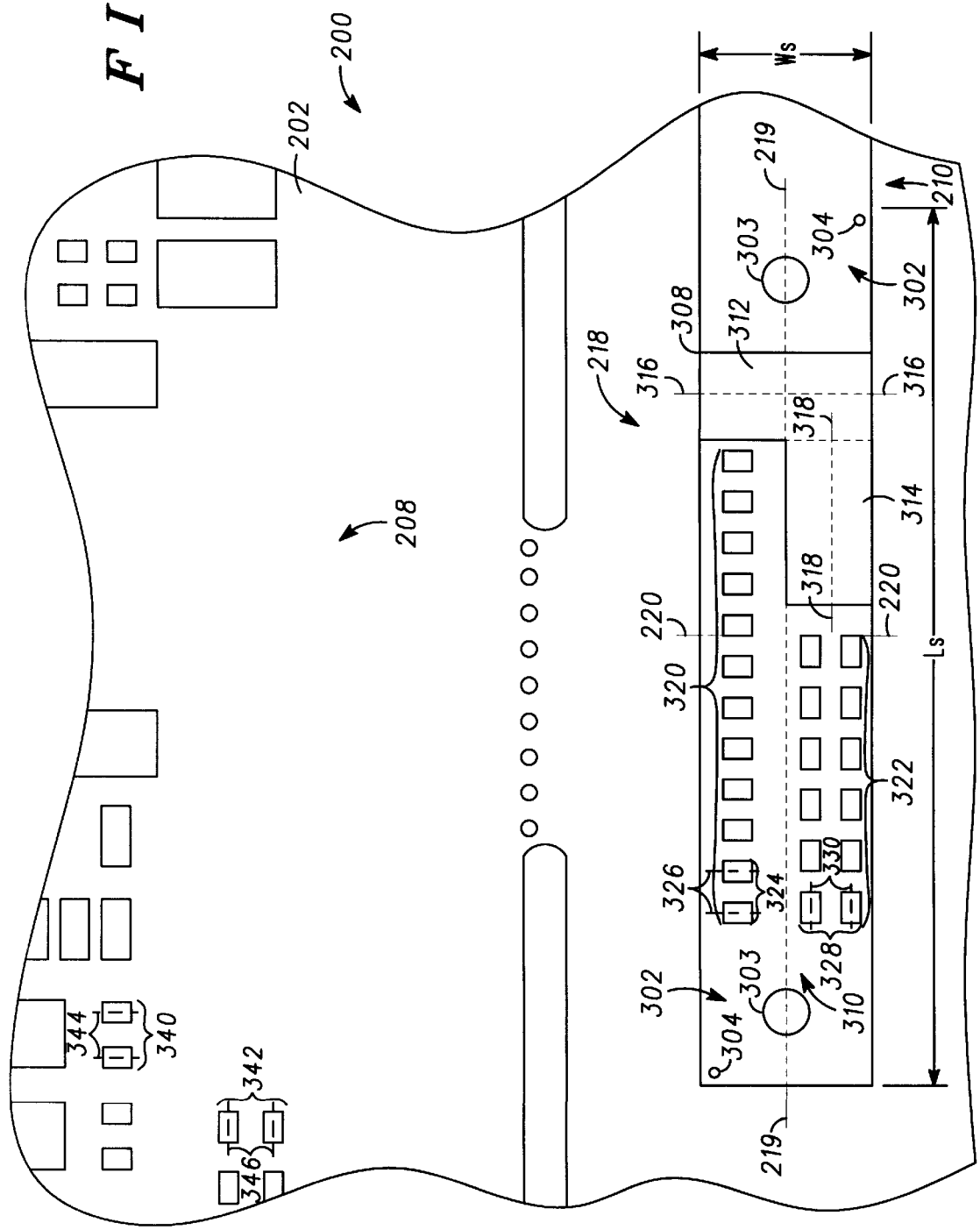
FIG. 3 is an enlarged, fragmentary top plan view of the circuit board and the associated test strip of FIG. 2.

Strip 210, which is representative of any one of the strips 209–211, includes a test pattern 218 carried on a left half of the window 216. The test pattern 218 has a longitudinal axis 219 and a transverse axis 220 perpendicular thereto. The longitudinal axis 219 is perpendicular to the longitudinal axis 206 of the board 202. In the illustrated embodiment, the test pattern 218, which is shown in more detail in FIG. 3, has a length Ls of approximately 15 mm and a width Ws of approximately 3 mm.

The test pattern 218 includes fiducials 302 and pads 308 and 310. The fiducials 302 and the pads 308 and 310 are preferably comprised of the same material as the pads 208 of the board 202. The fiducials 302 are arranged to provide an alignment reference for inspection. The fiducials 302 are circular and disposed near the ends of the test pattern 218. The fiducials 302 include a pair of large diameter fiducials 303 and a pair of small diameter fiducials 304 to be used in the event that the large diameter fiducials 303 become obscured by solder paste. A center of each of the large diameter fiducials 303 lies on the longitudinal axis 219 of the test pattern 218. The small diameter fiducials 304 are positioned in opposing corners of the test pattern 218.

The pad 308 is dimensioned to receive a solder print pattern. The pad 308 is "L"-shaped and has integrally joined vertical and horizontal rectangular segments 312 and 314. The segment 312 has a longitudinal axis 316 that is perpendicular to the longitudinal axis 219 of the test pattern 218. The segment 314, which extends from the segment 312, has a longitudinal axis 318 that is perpendicular to the longitudinal axis 316 of the segment 312 and parallel to the longitudinal axis 219 of the test pattern 218. In the illustrated embodiment, the segments 312 and 314 are approximately 3 mm in length (along the longitudinal axes 316 and 318, respectively,) and approximately 1.5 mm in width.

The pads 310 are arranged and dimensioned to receive electronic parts. The pads 310 are arranged in pairs along rows 320 and 322. Each of the rows 320 and 322, in the illustrated embodiment, has six pairs of pads of which pairs of pads 324 and 328, respectively, are representative. Each pad of the pair 324 includes a longitudinal axis 326 that is perpendicular to the longitudinal axis 219 of the test pattern 218. Each pad of the pair 328 includes a longitudinal axis 330 that is parallel to the longitudinal axis 219 of the test pattern 218. In the illustrated embodiment, each pad of the pairs 324 and 328 is approximately 0.5 mm in length (along the respective longitudinal axes 326 and 330), approximately 0.4 mm in width, and spaced apart from the other pad of its pair by approximately 0.4 mm.

The pairs of pads 324 and 328 of the pads 310 correspond to pairs of pads 340 and 342 of the pads 208 of the board 202. Each pad of pair 340 includes a longitudinal axis 344 that is parallel to the longitudinal axis 326 of each pad of the pair 324. Each pad of the pair 342 includes a longitudinal axis 346 that is parallel to the longitudinal axis 330 of each pad of the pair 328. The pairs 340 and 342 have similar dimensions and spacings as the pairs 324 and 328.

However, unlike the pads 208 of the board 202, the pads 310 of the strip 210 are electrically isolated. No metallic traces interconnect the pads 308 to one another or connect any of the pads 308 to the pads 208. Thus, no electrical circuit will be formed via the pads 310 upon receiving electronic parts.

Referring back to FIG. 2, the test strip block skip region 212 and the set of board block skip markers 213 are located on the leg 224 of the rail 204. The skip marker region 212 enables or disables the strips 209–211, respectively. When the skip region 212 is unoccupied, the strips 209–211 are disabled and will not be populated or inspected. When the skip region 212 is occupied by a marker, such as a piece of tape having a color that highly contrasts the color of the rail 204, the strips 209–211 will be populated and inspected. Left, center, and right ones of the set of board block skip markers 213 enable or disable population of the boards 201–203, respectively. When the skip markers 213 are left intact, the corresponding boards 201–203 will be populated. When the skip markers 213 are punched-out or removed, the corresponding boards 201–203 will not be populated. The skip markers 213 are comprised of copper, aluminum, or other material that highly contrasts the color of the rail 204. For discussion and illustrative purposes, the boards 201–203 will be populated in conjunction with the population of the strips 209–211.

Figure 4:
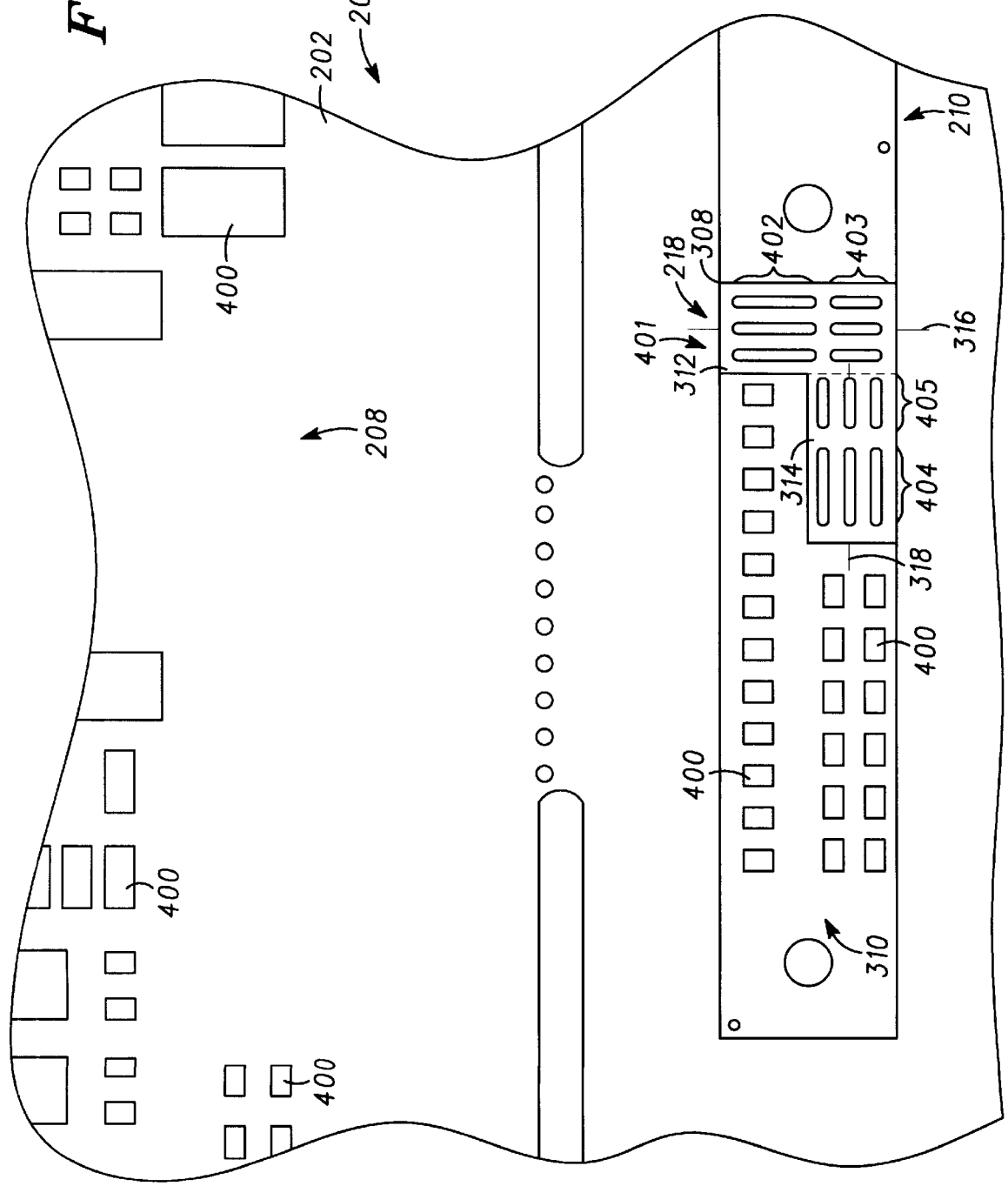
FIG. 4 is an enlarged, fragmentary top plan view of the circuit board and the associated test strip of FIG. 2 following a place solder paste step of the assembly process of FIG. 1.

Referring back to FIG. 1, following the load panel step 101, the assembly process 100 proceeds to the place solder paste step 102, as depicted by arrow 107. During the place solder paste step 102, solder paste 400 is placed on the pads 208 of the boards 201–203 and the pads 308 and 310 of the strips 209–211, as shown in FIG. 4 with respect to the board 202 and the strip 210. The solder paste 400 is a known tin-lead solder paste or suitable alternative. Placement of the solder paste 400 is performed by a known automated screen printer. The screen printer receives the panel 200; locates the panel 200 by reading the fiducials 230 of FIG. 2; places a stencil over the panel 200 such that the pads 208, 308 of FIG. 3, and 310 line up with openings in the stencil; and wipes the solder paste 400 across the stencil thereby depositing the solder paste 400 on the pads 208, 308, and 310. Sometimes, however, the stencil and panel 200 are misaligned due to, for example, operator setup error or normal wear and tear, and the solder paste 400 is inaccurately deposited.

The solder paste 400 is deposited on the pad 308 of the strip 210 in a print pattern 401 of columns and rows, as shown in FIG. 4. The pad 308 is under printed such that the print pattern 401 occupies less than all of the surface area of the pad 308. The print pattern 401 is deposited on the segment 312 of the pad 308 in long columns 402 and short columns 403. The columns 402 and 403 overlie, or are parallel to, the longitudinal axis 316 of the segment 312. The print pattern 401 is deposited on the segment 314 of the pad 308 in a pattern of long rows 404 and short rows 405. The rows 404 and 405 overlie, or are parallel to, the longitudinal axis 318 of the segment 314. In the illustrated embodiment, the long columns and rows 402 and 404 are spaced from the short columns and rows 403 and 405, respectively, by approximately 0.4 mm, and each one of the columns and rows 402–405 are spaced from one another by approximately 0.25 mm.

Referring back to FIG. 1, following the place solder paste step 102, the assembly process 100 proceeds to the place parts step 104, as depicted by arrow 108. During the place parts step 104, electronic parts 600 are placed in contact with the solder paste 400 on the pads 208 of the boards 201–203 and the pads 310 of the strips 209–211, as shown in FIG. 6 with respect to the board 202 and the strip 210. Placement of the parts 600 is performed by a known automated part placement machine. The part placement machines receives the panel 200; locates the panel 200 and the strips 209–211 by reading the fiducials 230 of FIG. 2 and the fiducials 302 of FIG. 6, respectively; locates and reads the marker region 212 and the skip markers 213; and, when the skip region 212 is occupied and the skip markers 213 are intact, places the parts 600 on the pads 208 and 310. Sometimes, however, the part placement machine is out of alignment due to, for example, operator setup error or normal wear and tear, and the parts 600 are inaccurately placed. In the illustrated embodiment, three part placement machines are employed during the place parts step 104 to populate the boards 201–203 and the strips 209–211.

The parts 600 are placed in contact with the solder paste 400 on the pads 310 to form a part pattern 602. In placing the parts 600 of the part pattern 602, the part placement machine is programmed to undergo all four possible part rotations—0 degrees, 90 degrees, 180 degrees, and 270 degrees. Part 604, which is representative of any one of the parts 600 occupying the row 320 of the pads 310 and specifically overlies the pair of pads 324 of the row 320, has a longitudinal axis 605 that is parallel to the longitudinal axis 219 of the test pattern 218 of the strip 210. Part 606, which is representative of any one of the parts 600 occupying the row 322 of the pads 310 and specifically overlies the pair of pads 328 of the row 322, has a longitudinal axis 607 that is perpendicular to the longitudinal axis 219 of the test pattern 218 of the strip 210. In the illustrated embodiment, the part pattern 602 consists of twelve parts, wherein each part is a sample of a different part rotation (0 degrees, 90 degrees, 180 degrees, and 270 degrees) of each of the three part placement machines employed in the place parts step 104. However, more or fewer parts may be used depending on the level of process control desired and the number of part placement machines employed. The parts 604 and 606 are the smallest ones of the parts 600 placed on the board 202, such as parts 610 and 612 overlying the pairs of pads 340 and 342, respectively, of the pads 208. In the illustrated embodiment, the parts 610 and 612 are chip resistors having dimensions of approximately 0.5 mm by approximately 1.0 mm.

Referring back to FIG. 1, following the place parts step 104, the assembly process 100 proceeds to the inspect test strip step 105, as depicted by arrow 111. During the inspect test strip step 103, the print pattern 401 of FIG. 4 is inspected to determine the accuracy of the screen printer, and the part pattern 602 of FIG. 6 is inspected to determine the accuracy of the part placement machine or machines. In the illustrated embodiment, inspection of the print and part patterns 401 and 602 is performed by a machine separate from the screen printer and part placement machine, such as the View Bazic 12 video metrology system. However, one skilled in the art will recognize that inspection could alternatively be performed by a charge coupled device camera and image processing unit installed in the screen printer or part placement machine, or other suitable vision or laser system.

Figure 5:
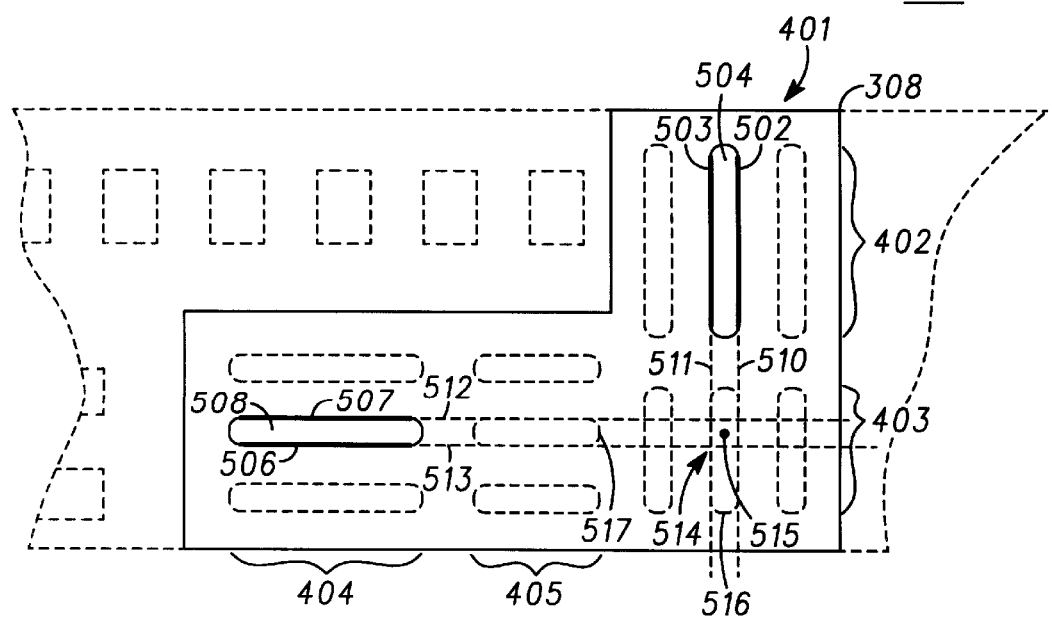
FIG. 5 is an enlarged, fragmentary top plan view of an image of the test strip of FIG. 4.

Inspection of the print pattern 401 begins by capturing an image 500 of the pad 308, as shown in FIG. 5. The image 500 is processed using gray scale image contrasting to detect edges 502 and 503 of center column 504 of the long columns 402, and to detect edges 506 and 507 of center row 508 of the long rows 404. For clarity, the remaining ones of the columns and rows 402–405 of the print pattern 401 are shown in dotted line. Pronounced differences in gray scale levels between the solder paste 400 of the columns and rows and the exposed material of the pad 308 simplifies detection and yields strong, consistent edges. The edges 502, 503, 506, and 507 are selected for detection because there is a greater chance that these edges will be inside the perimeter of the pad 308 in the event that the stencil of the screen printer is extremely misaligned. Lines 510, 511, 512, and 513 are constructed using a pixel regression line fit and collinearly projected from the edges 502, 503, 506, and 507, respectively. In the preferred embodiment, edges of center ones 516 and 517 of the short columns 403 and the short rows 405, respectively, are also detected to aid in accurate and straight projection of the lines 510–513. Intersection of the lines 510–513 forms a rectangle 514. A location at a center 515 of the rectangle is calculated using a known bisector analysis method or other similar method. The location is defined as the actual location of the print pattern 401. The actual location is compared to a prestored location of the print pattern 401 contained in a test strip layout that is, for example, stored in a memory associated with the video system. If the actual and prestored locations vary, the stencil on the screen printer is deemed to be misaligned. As depicted by feedback arrow 109 of FIG. 1, the misalignment is corrected by adjusting the stencil so that the solder paste 400 is accurately placed on subsequent ones of the panel 200 of FIG. 2.

In the event that the center columns 504 and 516 of the long and short columns 402 and 403, respectively, and the center rows 508 and 517 of the long and short rows 404 and 405, respectively, cannot provide consistent edges necessary for line projection due to, for example, smearing of the print pattern 401, other ones of the columns 402 and 403 and rows 404 and 405 are alternatively subjected to the inspection process described in conjunction with FIG. 5.

Figure 7:
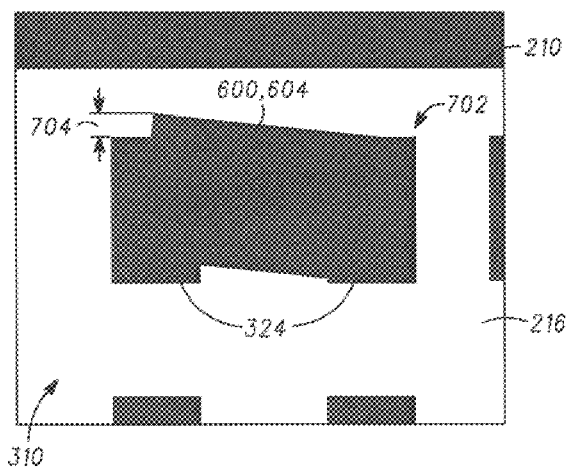
FIG. 7 is a n enlarged, f ragmen tray top plan view of a gray scale image of the test strip of FIG. 6 under back lighting during a second inspection step of the assembly process of FIG. 1.
Figure 8:
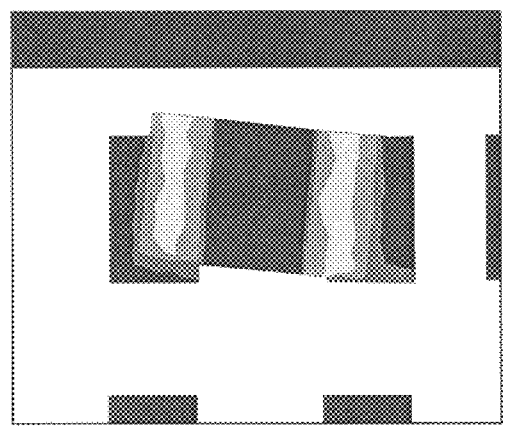
FIG. 8 is an enlarged, fragmentary top plan view of a gray scale image of the test strip of FIG. 6 under front lighting.

Inspection of the print pattern 401 begins by capturing an image 700 of the strip 210 under back lighting, as shown in FIG. 7. The translucent material of the window 216 of the strip 210 is illuminated from beneath to create a silhouette 702 of the pair of pads 324 and the part 604, which are representative of any pair of the pads 310 and the part 600 seated thereon. The silhouette 702 provides a sharp light-dark junction that eases detection of edges of the part 604 relative to the pads 324. In comparison, top lighting the strip 210, as shown in FIG. 8, generates many gray scale levels that impede accurate detection of the edges of the part 604 and, thus, is undesirable. Referring back to FIG. 7, once the edges of the part 604 relative to the pads 324 are detected, a known method of calculating the actual location of the part 604 is performed. If the actual location falls outside a range of prestored locations of the part 604 stored in the test strip layout, the part placement machine is deemed to be misaligned. For example, in FIG. 7, the part 604 has an unacceptable amount of skew 704 that causes the part 604 to fall out of the range of prestored locations. As depicted by feedback arrow 112 of FIG. 1, the misalignment is corrected by adjusting the part placement machine so that the parts 600 are accurately placed on subsequent ones of the panel 200 of FIG. 2.

Referring back to FIG. 1, following the inspect test strip step 105, the assembly process 100 proceeds to the reflow step 106, as depicted by arrow 113. During the reflow step 106, the panel 200 of FIG. 2 is heated to a temperature sufficient to melt the solder paste 400 of FIG. 6. The melted solder paste adheres to the parts 600 to form an intermetallic, electrically conductive bond between the parts 600 and the pads 208 and 310 upon cooling. Once cooled, the breakaways 205 of FIG. 2 are broken by twisting the rail 204 upward or downward relative to the boards 201–202. Once broken, the rail 204 is detached from the boards 201–202, which are installed into housings to form electronic devices. The rail 204, including the populated strips 209–211 thereon, are discarded.

Thus, it can be seen that high quality in an assembly process can be maintained without complete inspection of the circuit board assembled by the process if a test strip is employed. The test strip is populated with a small amount of solder paste and a small quantity of electronic parts, and inspected for accuracy. Inaccuracies found in the population of the test strip indicate inaccuracies likely to occur during population of the circuit board. The process can be corrected to resolve the inaccuracies prior to populating subsequent circuit boards with a relatively large amount of solder paste and a relatively large quantity of electronic parts. As such, the test strip provides statistical process control data to statistically infer accuracy of placement of paste and electronic parts on the circuit boards. Although shown above to be associated with a circuit board having a specific topography, one will recognize the commonality of the test strip and its use with virtually any circuit board.

What is claimed is:

1. A circuit board panel assembly method comprising the steps of:
    providing a circuit board panel comprising a circuit board and a test strip, the circuit board having a plurality of pads to receive solder paste and electronic parts during assembly of the circuit board, the test strip having at least one pad isolated from the plurality of pads;
    placing solder paste on the at least one pad of the test strip;
    placing at least one of the electronic parts on the test strip in contact with the solder paste on the at least one pad of the test strip; and
    inspecting the test strip to determine accuracy of assembly of the circuit board.

2. A method according to claim 1 wherein the step of placing solder paste comprises the steps of:
    placing first and second columns of solder paste on the at least one pad of the test strip; and
    placing first and second rows of solder paste on the at least one pad of the test strip.

3. A method according to claim 2 wherein the step of inspecting comprises the steps of:
    detecting edges of the first and second columns of solder paste;
    detecting edges of the first and second rows of solder paste;
    collinearly projecting lines from the detected edges of the first and second columns of solder paste;
    collinearly projecting lines from the detected edges of the first and second rows of solder paste; and
    calculating a location of an intersection of the projected lines.

4. A method according to claim 1 wherein the step of inspecting comprises the step of:
    inspecting the at least one of the electronic parts for misalignment on the at least one pad of the test strip.

5. A method according to claim 4 wherein the step of inspecting the at least one of the electronic parts comprises the step of:
    back lighting the test strip to create a silhouette of the at least one pad of the test strip and the at least one of the electronic parts, the silhouette having a sharp light-dark junction;
    detecting edges of the at least one of the electronic parts from the silhouette; and
    calculating a location of the at least one of the electronic parts from the detected edges.

6. A method according to claim 1 wherein
    the step of placing solder paste comprises the step of placing solder paste on first, second, third and fourth pads of the at least one pad of the test strip; and
    the step of placing the at least one of the electronic parts comprises the steps of:
        placing a first part of the at least one of the electronic parts in contact with the solder paste on the first and second pads; and
        placing, following placing of the first part, a second part of the at least one of the electronic parts in contact with the solder paste on the second and third pads such that a longitudinal axis of the second part is perpendicular to a longitudinal axis of the first part.

7. A method according to claim 1 wherein
    the step of placing solder paste comprises the step of placing solder paste on first, second, third, fourth, fifth, sixth, seventh and eighth pads of the at least one pad of the test strip; and
    the step of placing the at least one of the electronic parts comprises the steps of:
        rotating a part placement machine 0 degrees to place a first part of the at least one of the electronic parts in contact with the solder paste on the first and second pads;
        rotating a part placement machine 90 degrees to place a second part of the at least one of the electronic parts in contact with the solder paste on the third and fourth pads;
        rotating a part placement machine 180 degrees to place a third part of the at least one of the electronic parts in contact with the solder paste on the fifth and sixth pads; and
        rotating a part placement machine 270 degrees to place a fourth part of the at least one of the electronic parts in contact with the solder paste on the seventh and eighth pads.

8. A method according to claim 6 wherein the step of placing solder paste comprises the steps of:
  placing first and second columns of solder paste on a fifth pad of the at least one pad of the test strip; and
  placing first and second rows of solder paste on the fifth pad of the at least one pad of the test strip.

9. A circuit board panel assembly method comprising the steps of:
  providing a circuit board panel comprising a circuit board and a test strip, the circuit board having a plurality of pads to receive solder paste and a plurality of electronic parts during assembly of the circuit board, the test strip having a plurality of pads isolated from the plurality of pads of the circuit board;
  depositing a plurality of lines of solder paste on a first pad of the plurality of pads of the test strip to form a print pattern; and
  inspecting the print pattern to determine accuracy of solder paste placement during assembly of the circuit board.

10. A method according to claim 9 wherein the step of depositing further comprises the steps of:
  depositing a first line of the plurality of lines of solder paste along a first longitudinal axis; and
  depositing a second line of the plurality of lines of solder paste along a second longitudinal axis that is perpendicular to the first longitudinal axis.

11. A method according to claim 10 wherein the step of inspecting comprises the steps of:
  detecting edges of the first and second lines of the plurality of lines of solder paste;
  collinearly projecting lines from the detected edges of the first and second lines of the plurality of lines of solder paste;
  calculating a location of an intersection of the projected lines; and
  comparing the calculated location to a prestored location.

12. A method according to claim 9 wherein the step of depositing further comprises the step of depositing the plurality of lines of solder paste on the first pad of the plurality of pads of the test strip in a plurality of columns and rows.

13. A method according to claim 12 wherein
  the step of providing comprises the steps of:
    providing the first pad with first and second segments, the first segment having a longitudinal axis, the second segment having a longitudinal axis perpendicular to the longitudinal axis of the first segment; and
  the step of depositing comprises the steps of:
    depositing the plurality of lines of solder paste on the first segment in first and second columns, each of the plurality of lines of solder paste of the first column having a first length, each of the plurality of lines of solder paste of the second column having a second length different from the first length; and
    depositing the plurality of lines of solder paste on the second segment in first and second rows, each of the plurality of lines of solder paste of the first row having a third length, each of the plurality of lines of solder paste of the second row having a fourth length different from the third length.

14. A method according to claim 12 wherein the step of inspecting comprises the steps of:
  detecting edges of first and second lines of solder paste of the plurality of columns;
  detecting edges of first and second lines of solder paste of the plurality of rows;
  collinearly projecting lines from the detected edges of the first and second lines of solder paste of the plurality of columns;
  collinearly projecting lines from the detected edges of the first and second lines of solder paste of the plurality of rows;
  calculating a location of an intersection of the projected lines; and
  comparing the calculated location to a prestored location.

15. A circuit board panel assembly method comprising the steps of:
  providing a circuit board panel comprising a circuit board and a test strip, the circuit board having a plurality of pads to receive solder paste and electronic parts during assembly of the circuit board, the test strip having a plurality of pads isolated from the plurality of pads of the circuit board;
  placing electronic parts on the plurality of pads of the test strip to form a part pattern; and
  inspecting the part pattern to determine accuracy of electronic part placement during assembly of the circuit board.

16. A method according to claim 15 wherein the step of placing comprises the steps of:
  placing a first part of the electronic parts on corresponding ones of the plurality of pads; and
  placing, following placing of the first part, a second part of the electronic parts on corresponding ones of the plurality of pads such that a longitudinal axis of the second part is perpendicular to a longitudinal axis of the first part.

17. A method according to claim 15 wherein the step of inspecting comprises the step of:
  back lighting the test strip to create a silhouette of the electronic parts, the silhouette having a sharp light-dark junction;
  detecting edges of the electronic parts from the silhouette;
  calculating a location of the electronic parts from the detected edges; and
  comparing the calculated location to a prestored location.

18. A method according to claim 15 wherein
  the step of providing comprises the step of providing the electronic parts for assembly of the circuit board, the electronic parts having a plurality of sizes; and
  the step of placing comprises the step of placing smallest ones of the electronic parts on the plurality of pads of the test strip to form the part pattern.

19. A method according to claim 15 wherein the step of placing comprises the steps of:
  rotating a part placement machine 0 degrees to place a first part of the electronic parts on first and second pads of the plurality of pads;
  rotating a part placement machine 90 degrees to place a second part of the electronic parts on third and fourth pads of the plurality of pads;
  rotating a part placement machine 180 degrees to place a third part of the electronic parts on fifth and sixth pads of the plurality of pads; and
  rotating a part placement machine 270 degrees to place a fourth part of the electronic parts on seventh and eighth pads of the plurality of pads.

* * * * *